United States Patent [19]

Seitz

[11] Patent Number: 5,014,006
[45] Date of Patent: May 7, 1991

[54] THIN FILM MAGNETIC CORE DEVICE WITH A PAIR OF MAGNETIC CIRCUITS FOR MEASURING A WEAK MAGNETIC FLUX

[75] Inventor: Thomas Seitz, Zug, Switzerland

[73] Assignee: LGZ Landis & Gyr Zug AG, Zug, Switzerland

[21] Appl. No.: 537,072

[22] Filed: Jun. 12, 1990

Related U.S. Application Data

[62] Division of Ser. No. 353,233, May 17, 1989, Pat. No. 4,967,156, which is a division of Ser. No. 121,536, Nov. 17, 1987, Pat. No. 4,864,238.

[30] Foreign Application Priority Data

Nov. 25, 1986 [CH] Switzerland .................. 04711/86
Aug. 20, 1987 [CH] Switzerland .................. 03201/87

[51] Int. Cl.$^5$ .................. G01R 33/05; G07D 7/00; G11B 5/33
[52] U.S. Cl. .................. 324/249; 324/253; 360/111
[58] Field of Search .................. 324/244, 249, 253–255, 324/260; 360/111, 115, 123, 125; 235/449, 450, 493; 209/562, 567, 569; 194/317–320

[56] References Cited

U.S. PATENT DOCUMENTS

| 3,016,427 | 1/1962 | Grant | 360/111 |
| 3,258,687 | 6/1966 | Heppner et al. | |
| 3,271,665 | 9/1966 | Castro et al. | 324/249 |
| 3,280,974 | 10/1966 | Riddle et al. | |
| 3,518,534 | 6/1970 | Bader | 324/249 |
| 3,612,835 | 12/1971 | Andrews et al. | 235/440 |
| 3,643,155 | 2/1972 | Riddle et al. | |
| 3,657,641 | 4/1972 | Kardashian | 324/249 |
| 3,829,894 | 8/1974 | Watanabe et al. | 360/111 |
| 3,891,995 | 6/1975 | Hanazono et al. | 360/123 |
| 3,992,691 | 11/1976 | Molthen | |
| 4,182,987 | 1/1980 | Moeller | 324/249 |
| 4,402,034 | 9/1983 | Parker et al. | 324/253 X |
| 4,522,671 | 6/1985 | Grunwald et al. | |
| 4,583,143 | 4/1986 | Tabei | 360/123 |
| 4,649,755 | 3/1987 | Volz | |
| 4,728,888 | 3/1988 | Bauer et al. | 324/253 |
| 4,777,465 | 10/1988 | Meinel | |

FOREIGN PATENT DOCUMENTS 3420709 12/1985 Fed. Rep. of Germany .

Primary Examiner—Gerard R. Strecker
Attorney, Agent, or Firm—Marmorek, Guttman & Rubenstein

[57] ABSTRACT

A device for measuring a weak magnetic field is disclosed. The device includes a substrate, a magnetic core having a high magnetic permeability and in the form of a surface film on a substrate, and at least two coils magnetically coupled to the magnetic core. A pulse generator is connected to one of the coils and is used to drive the magnetic core into intermittent saturation. The other coil is used to generate an output signal. The device can be used for measuring the weak magnetic fields associated with bank notes for identifying the values of the bank notes.

3 Claims, 12 Drawing Sheets

THIN FILM MAGNETIC CORE DEVICE WITH A PAIR OF MAGNETIC CIRCUITS FOR MEASURING A WEAK MAGNETIC FLUX

This is a division of application Ser. No. 353,233, filed May 17, 1989, U.S. Pat. No. 4,961,156, which is a division of Ser. No. 121,536, filed Nov. 17, 1987, U.S. Pat. No. 4,864,238.

FIELD OF THE INVENTION

The invention relates to a device for measuring a weak magnetic field and particularly to a device which compensates for the terrestrial magnetic field while providing a high signal-to-noise ratio and being suitable for being produced by planar micro-technology.

BACKGROUND OF THE INVENTION

Devices for measuring weak magnetic fields are used commercially. Such a device is used in equipment for providing monetary change in order to distinguish between bank notes which may have the same size and color. The bank notes are inscribed with a magnetic ink to enable the values to be detected. The bank notes in the monetary change dispenser are subjected to a constant magnetic field which magnetizes the magnetic ink in a predetermined direction before the bank notes are conveyed past the device for measuring the weak magnetic field to be used for identifying the values of the bank notes.

The magnetic ink retains a residual magnetic field after passing through the constant magnetic field so that the characters in the magnetic ink act as tiny permanent magnets oriented in the same spatial direction. Such residual magnetic fields are weak and exhibit a magnetic flux on the order of approximately 2.5 Webers per square millimeter. The device for measuring the weak magnetic field is used to measure the magnetic fields produced by the characters which are acting as permanent magnets.

The inscriptions on the bank notes differ from each other in accordance with the value of the bank note and these differences are detected in the magnetic fields. The device should scan the bank notes without touching them and the distance between the device and the bank note is usually at least one millimeter. This minimal distance is desirable because bank notes can be crumpled and the descriptions on the bank notes should not be worn off or damaged through friction as the bank notes are conveyed past the device.

Devices for measuring low magnetic fields have other applications. For example, electrical meters and power meters can obtain a measurement of electrical current by making a measurement of the magnetic field which is proportional to that electrical current.

U.S. Pat. No. 3,280,974 discloses a device for measuring weak magnetic fields for determining the value of U.S. bank notes, particularly FIGS. 8 and 9 of the patent. The patent discloses a curved fluxgate operating on a well-known principle of the saturation core probe. A conventional, rod-shaped fluxgate is well suited for measuring weak magnetic fields because of its high sensitivity due to a large number of windings and because of its high resolution. The conventional, rod-shaped fluxgate is, however, less suited for this application because its configuration is not suited for plotting weak magnetic field sources having low magnetic fluxes. Such a fluxgate is disclosed in the prior art and includes a magnetic core having a very low magnetic reluctance material such as a plate made of Mu-metal. The present commercial technology presents difficulties in producing two identical fluxgates to compensate for the terrestrial magnetic field using a compensating circuit including two probes.

SUMMARY OF THE INVENTION

The present invention overcomes the limitations of the prior art devices by providing two identical probes for compensating for the local magnetic field in one compensating circuit that is easily implemented and has a large signal-to-noise ratio without a significant reduction of the useful signal. The devices according to the invention are suitable for being manufactured using planar micro-technology and can be manufactured economically with high precision and reproducibility.

In one embodiment, the invention includes a substrate, a magnetic core having a magnetic permeability of at least about $10^5$ and defining a magnetic circuit, and at least first and second coils magnetically coupled to the magnetic core. At least one of the coils is in the form of a flat coil. The magnetic core is in the form of a surface film on a first surface layer on the substrate and has a maximum thickness of less than about ten microns. In addition, pulsing means is coupled to the first coil and provides electrical current pulses so that the magnetic core is intermittently driven to magnetic saturation. The second coil provides a source of an output signal. At least one of the coils has electrical conductors which are electrically insulated from the magnetic core and is at least partially on at least one additional surface layer on the substrate.

Steps can be taken for compensating for the possible variation in distance between the magnetic field sensor and a bank note and for the terrestrial magnetic field by the use of two devices, one for each side of the bank note and coupled into a differential system. Producing identical devices for such applications and tuning the two devices can be accomplished without undue difficulty by the use of modern planar micro-technology. Furthermore, the use of planar micro-technology for producing devices according to the invention enables relatively economical cost for producing devices which are very small, highly precise and are highly reproducible.

BRIEF DESCRIPTION OF THE DRAWINGS

Embodiments of the invention are described in greater detail in connection with the drawings in which:

FIG. 10a is a front elevational view of a diagrammatic representation of a third embodiment of a magnetic core and coils according to the invention;

FIG. 10b is a side elevational view of the magnetic core shown in FIG. 10a.

Identical reference numbers designate similar parts in all the figures of the drawings.

In the drawings, a location of a magnetized ink is represented by a vector symbolizing the magnetic field M of the corresponding permanent magnet to be measured.

DESCRIPTION OF THE INVENTION

Figure 1:
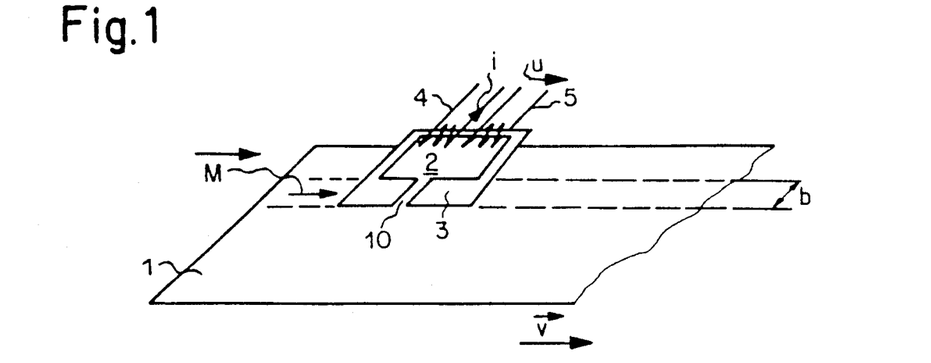
FIG. 1 is a diagrammatic representation of a first embodiment of the invention showing the spatial position of the device relative to a bank note.
Figure 2:
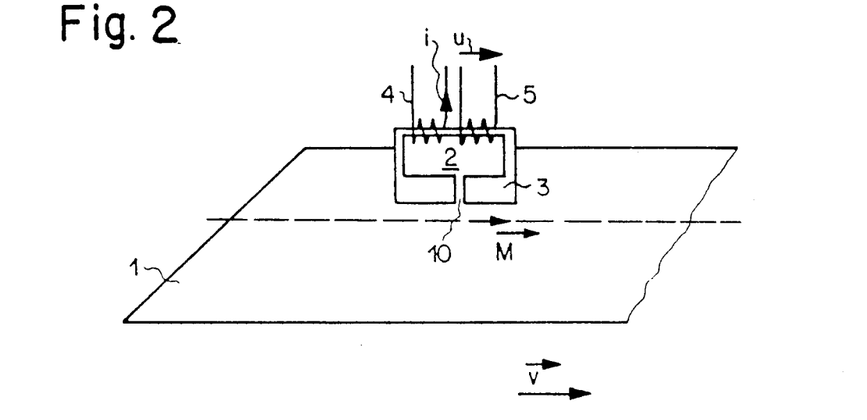
FIG. 2 is a diagrammatic representation of a second embodiment of the invention showing the spatial position of the device relative, to a bank note.
Figure 3:
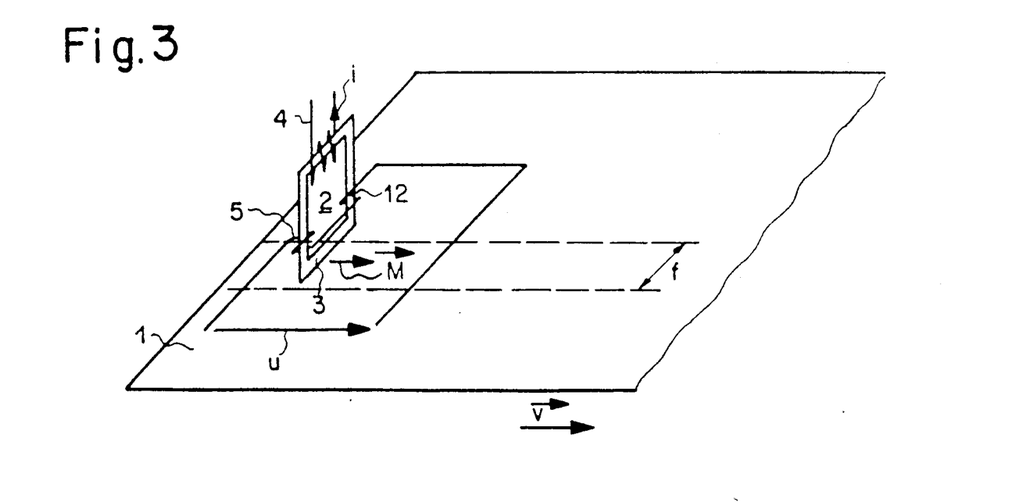
FIG. 3 is a diagrammatic representation of a third embodiment of the invention showing the relative position of the device relative to a bank note.

Turning to FIGS. 1 to 3, a bank note 1 and a device 2 according to the invention for measuring a weak magnetic field M are shown diagrammatically. Bank note 1 is shown in a horizontal plane and moves from left to right at a velocity v as indicated in FIGS. 1 to 3. It is assumed herein that there is magnetic ink on the bank note 1 and that it has been magnetized in the direction of the movement of the bank note 1, i.e. that the vector representing the magnetic field M of the magnetized ink is parallel to the direction of the continued movement of the bank note 1.

The device 2 includes a magnetic core 3 made of a ferromagnetic material and generally constitutes at least one magnetic circuit. The magnetic circuit can include a magnetic discontinuity 10. FIGS. 1 and 2 show the magnetic circuit including a magnetic discontinuity 10 while FIG. 3 shows the magnetic circuit without the magnetic discontinuity. The arrangements shown in FIGS. 1 to 3 are representative examples and it is possible to provide any of the spatial arrangements shown in FIGS. 1 to 3 with either of the two embodiments of devices 2 shown in FIGS. 1 to 3.

In each of the FIGS. 1 to 3, at least two coils 4 and 5 are wound around the magnetic core 3. In each case, the coil 4 is supplied electrical current pulses i from a pulse generator (not shown) at a level sufficient to drive the magnetic core 3 to reach magnetic saturation intermittently. Also, in each of the FIGS. 1 to 3, the coil 5 is used to provide the output signal of the device 2 and thereby functions as a sensor coil. The output voltage of the coil 5 is designated as "u".

The magnetic core 3 includes a thin film. In FIG. 1 the film of the magnetic core 3 is positioned parallel to the bank note 1 so that the length of the magnetic discontinuity 10 extends parallel to the bank note with its width "b" extending perpendicular to both the magnetic field M and the velocity v. The width of the reading track of the device 2 shown in FIG. 1 is equal to "b".

In FIG. 2, the film of the magnetic core 3 is positioned perpendicular to the bank note 1 and parallel to both the magnetic field M and the velocity v. The resulting reading track of the device 2 in FIG. 2 is extremely narrow so that a practical system would use several devices 2 next to each other and parallel to each other.

In FIG. 3, the film of the magnetic core 3 is also perpendicular to the bank note 1 but perpendicular and transverse to the direction of both the magnetic field M and the velocity v. The resulting width of the reading track is equal to the width "f" of the magnetic core 3. In addition, a third coil 12 is installed on the magnetic core 3. The coils 5 and 12 are substantially equal in size, electrically connected in series, and positioned so that the bottom of each is on one of the two vertical portions of the magnetic core 3. The output voltage u of the series circuit of coils 5, 12 is the output voltage u of the device 2. The coil 4 is located on an upper portion of the magnetic core 3.

Figure 4:
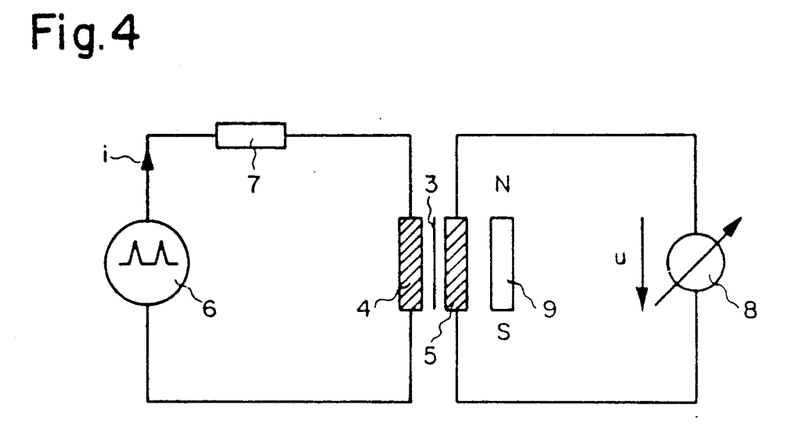
FIG. 4 is a circuit diagram of a plotting device for a magnetic field according to the invention.

A circuit diagram of a device according to the invention is shown in FIG. 4 and includes the coils 4 and 5 coupled to each other through the magnetic core 3, a pulse generator 6, a resistor 7, a voltmeter s and a permanent magnet 9. The pulse generator 6 is coupled to the coil 4 through the resistor 7 and supplies electrical current pulses i. The electrical current pulses i as a function of time can be in the form of a saw-tooth current wave rectified by a half-wave rectifier to produce a saw-tooth wave in which the negative portion is equal to zero. Generally, a saw-tooth wave configuration of the electrical current i causes relatively lower losses in the magnetic core 3 than a sinsoidal wave having the same amplitude. The voltmeter 8 can be an AC voltmeter connected to the coil 5 for measuring the output voltage.

Figure 6:
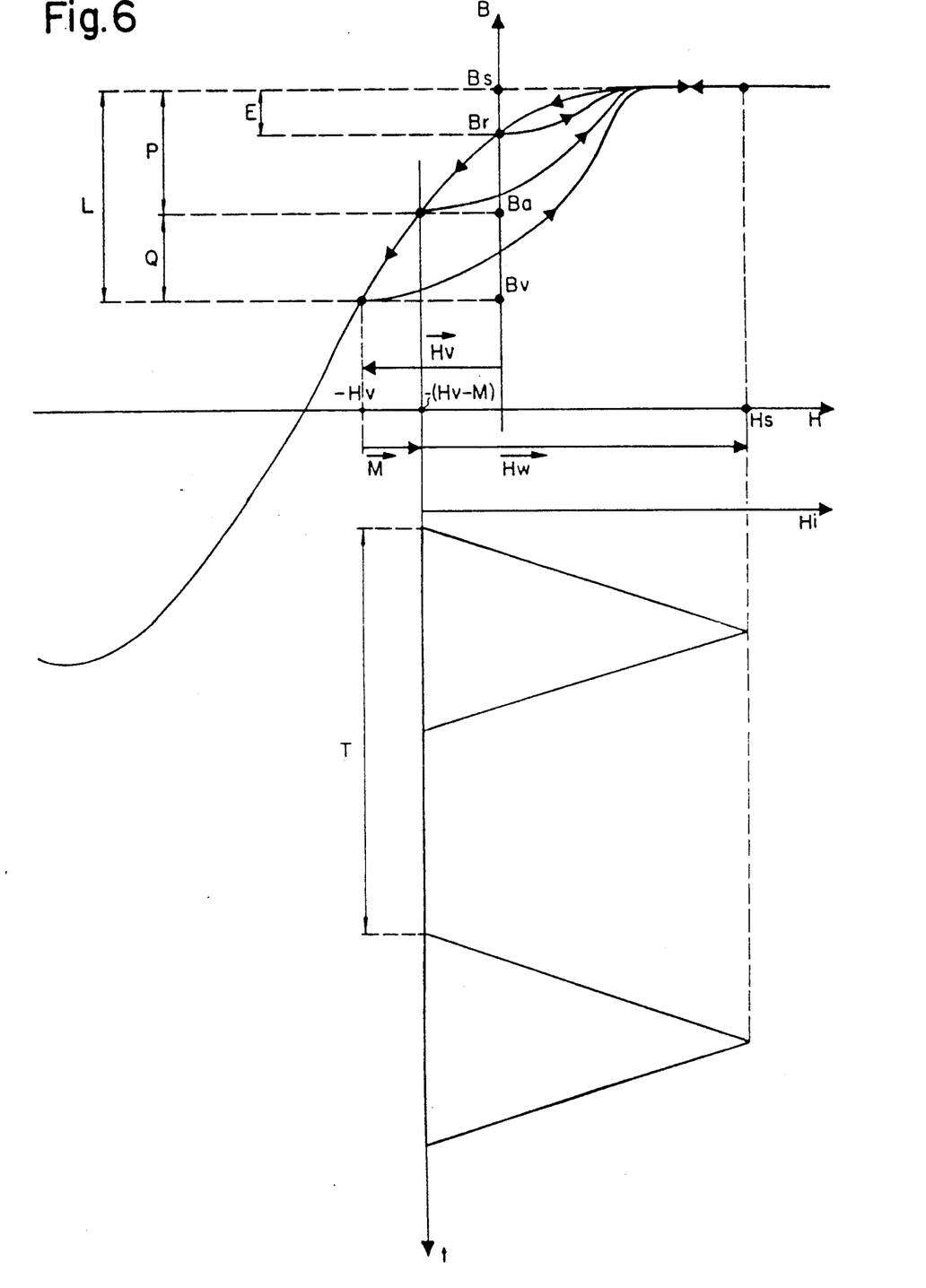
FIG. 6 is a representative characteristic hysteresis curve along an input signal versus time.

The permanent magnet 9 can be made of SmCo5 and is positioned near the magnetic core 3 so that its magnetic field Hv magnetizes the magnetic core 3 in a negative direction relative to the magnetic field Hw as indicated in FIG. 6. The position of the permanent magnet 9 can be selected so that the point of remanence and therefore the periodic starting point of the hysteresis loop is shifted into the portion of the characteristic magnetization curve which is highly sensitive to a magnetic field.

Figure 5:
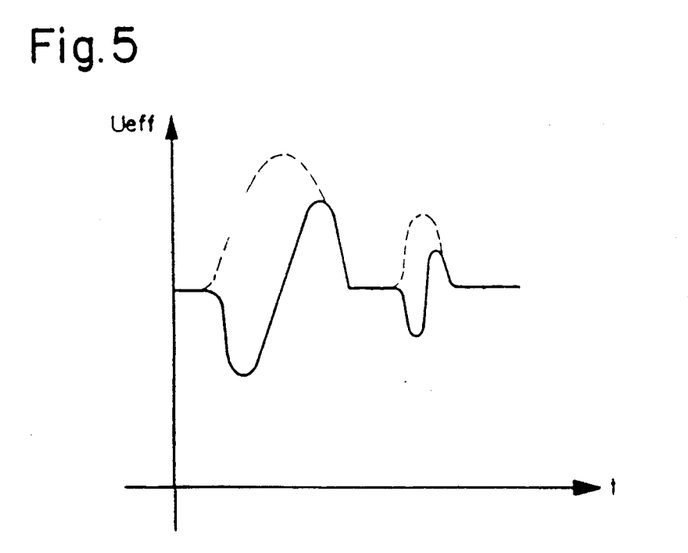
FIG. 5 is a graph of output signals versus time for possible output signals for a device according to the invention.

In FIGS. 1 to 3, the movement of the bank note 1 below the device 2 produces an effective output voltage of Ueff from the output voltage u as shown in FIG. 5. In particular, the broken line curve in FIG. 5 relates to the devices 2 shown in FIGS. 1 and 2 while the solid line curve in FIG. 5 relates to the device 2 shown in FIG. 3. Each of the curves in FIG. 5 includes a plurality of irregular periods, each with its own region of constant value. FIG. 5 shows only two periods.

FIG. 6 shows several graphs including a characteristic hysteresis curve for an induction flux B for the magnetic core 3 as a function of the magnitude of magnetic field H. When the value of the magnetic field H has been reduced to zero, the induction flux B has a residual flux value of Br. The saturation induction flux of the magnetic core 3 is equal to Bs. The magnetic field Hv of the permanent magnet 9 is oriented in a negative direction so that in the absence of the magnetic field M to be measured, the operating point of the hysteresis curve is moved down from Br to Bv because the induction value Bv corresponds to −Hv. In the presence of the magnetic field M, there is a positive magnetic field so that the operating point shifts upward along the hysteresis curve from Bv to Ba and Ba is the induction value B at the magnetic field −(Hv−M).

The rectified saw-tooth electrical current pulses i delivered by the pulse generator 6 to the coil 4 produces a proportional magnetic field Hi which varies in time as shown in the lower portion of FIG. 6. The magnetic field Hi has a period T corresponding to the electrical current pulses i and a peak amplitude Hw selected to be sufficiently large so that the magnetic core 3 reaches positive saturation. This flux in the magnetic core 3 moves up the hysteresis curve as the magnetic field Hi increases in the positive direction to produce an induction flux Ba. This flux in the magnetic core 3 continues as the magnetic field Hi increases and returns to the value for which the induction flux is Ba.

For each period T of the magnetic field Hi, the induction flux B in the magnetic core 3 goes through a hysteresis loop which starts at Ba for a given magnetic field M. Thus, the induction flux B starting from Ba continues up the right branch of the hysteresis loop to reach the saturation induction flux Bs. The operating point then runs through the positive saturation branch of the hysteresis loop up to the value of Hs=Hw−(Hv−M) of the magnetic field H and subsequently returns to leave the saturation zone through the left branch of the hysteresis loop until it returns to the starting induction flux Ba.

Figure 7:
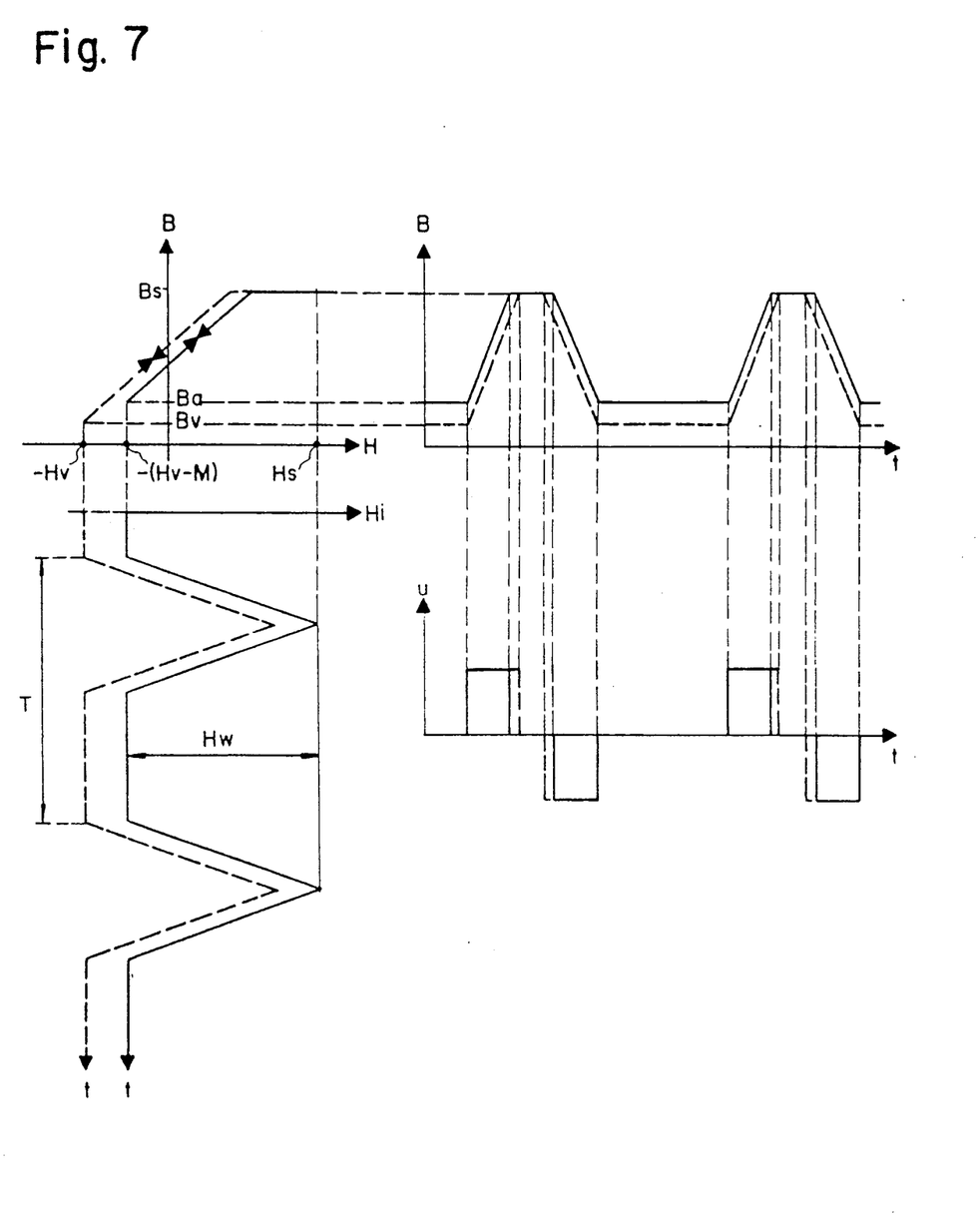
FIG. 7 is a graph of output signal versus time produced by an idealized characteristic hysteresis curve for an input signal versus time.

The operation of the characteristic hysteresis curve will now be explained in greater detail through an idealized characteristic curve shown in FIG. 7. The left portion of the representation shown in FIG. 7 is an idealized version of the characteristic hysteresis curve of FIG. 6. In each partial depiction of FIG. 7, a characteristic curve for the case that M=0 is shown in a broken line and a characteristic curve for the case that M>0 is shown in a solid line.

As described in connection with FIG. 6, the solid line characteristic curve in the upper left portion of FIG. 7 starts with an induction flux Ba which is equal in value to the induction flux B corresponding to H=−(Hv−M). The corresponding broken line characteristic curve starts with the induction flux B, which is equal in value to the induction flux B corresponding to H=−Hv because M=0 applies to this characteristic curve.

The upper right hand of FIG. 7 shows the variation of the induction flux B when the magnetic field Hi takes effect. This variation is shown in the idealized characteristic hysteresis curve by straight lines and includes positive, trapezoidal pulses which are separated from each other in time by constant values. FIG. 7 shows a comparison between the output of B versus time for the broken line trapezoidal characteristic curve and the solid line trapezoidal characteristic curve. As indicated, an existing positive magnetic field M enlarges the width of the tops of the trapezoidal pulses of B. The amplitudes of the trapezoidal pulses are equal to Bs−Ba or equal to Bs−Bv. These amplitudes correspond to the values of P and L shown in FIG. 6. The saturation induction flux Bs is the reference value and the two induction fluxes Ba and Bv are selected to be as low as possible so that the amplitude of the trapezoidal pulses can be as large as possible.

In operation, the trapezoidal induction flux B in the magnetic core 3 induces the output voltage u in the form of rectangular bipolar pulses in the coil 5. The variation of the output voltage u versus time is shown in the graph at the lower right of FIG. 7. It is known that the output voltage u is proportional to dF/dt, where F designates the magnetic flux flowing through the coil 5. The rectangular pulses are only present for as long as the flanks or slopes of the trapezoidal pulses of the induction B are present. At all other times, i.e. between the rectangular pulses, the value of u is equal to zero because the amplitudes of the trapezoidal pulses of B are constant.

The changes in the width of the tops of the trapezoidal pulses of B due to the presence of the magnetic field M produces a reduction in the pulse width of the rectangular pulses of u. A Fourier analysis of the rectangular pulses of u indicates that the amplitude of the second harmonic frequency is approximately proportional to the value of M or, expressed more generally, the information relating to M is contained in the amplitudes of the even-numbered harmonic frequencies. The odd-numbered harmonic frequencies, primarily the first harmonic frequency, present interferences to the desired measurement The second harmonic frequency can be filtered at a fluxgate by means of a filter but such a filter is generally expensive. The use of such a filter enables the value of M to be obtained by continuously measuring the amplitude of the second harmonic frequency. The device shown in FIG. 4 does not require the use of an expensive filter and enables measurement of the magnetic field M produced by the magnetized ink. The voltmeter 8 in FIG. 4 measures the effective value of the rectangular pulses of u by indicating the mean value of the square value of these rectangular pulses. This is a typical operation of conventionally available voltmeters. In this measurement, the odd-numbered harmonic frequencies act as an interference signal and results in an offset voltage even when the measured value of M is zero.

The interference ratio between the first and second harmonic frequencies is in the order of 1000:1 in a conventional cylindrical fluxgate. In contrast, this interference ratio is only 30:1 in the device according to the invention because of the relatively very large reduction of the cross-section of the magnetic core. This improvement is enhanced by reducing the thickness of the film of the magnetic core 3 using chemical post-etching to obtain a thickness below the conventional minimal layer thickness of 0.025 mm to less than 10 microns. The use of such a small thickness for the film has additional advantages including suppressing the skin effect when operating with high frequency electrical current pulses i. Furthermore, the thin film is easily magnetized.

Figure 8:
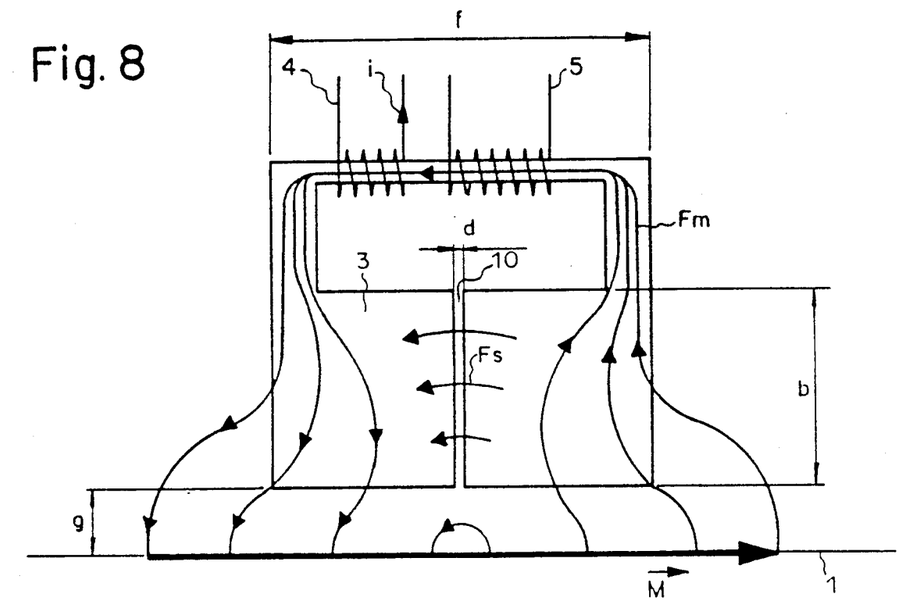
FIG. 8 is a first embodiment of a magnetic core and coils according to the invention.

In FIG. 8, a first embodiment of the magnetic core 3 is shown in a plan view and includes a rectangular portion having a magnetic discontinuity 10 of length d. The connecting portions of the magnetic core 3 which include the magnetic discontinuity 10 are significantly wider than the other connecting portions of the magnetic cores 3 and each has a width b. These dimensions are used because the magnetic core 3 is a thin film. The lower edge of the magnetic core 3 in FIG. 8 is parallel to the bank note 1 and to the vector representing the magnetic field M to be measured. The distance between the lower edge of the magnetic core 3 and the bank note 1 is equal to g, which is at least one millimeter.

The weak magnetic flux lines of the magnetic field M penetrate from the lower right side as shown in FIG. 8, into the magnetic core 3 wherein a portion of the flux lines flow through the magnetic core 3 in the form of a useful magnetic flux Fm while the remainder flows in the form of an unusable leakage flux Fs through the magnetic discontinuity 10. A smaller portion of the magnetic flux closes on itself in the space between the magnetic core 3 and the bank note 1. The coils 4 and B are located on a connecting portion of the magnetic core 3 without any magnetic discontinuity 10.

Figure 9:
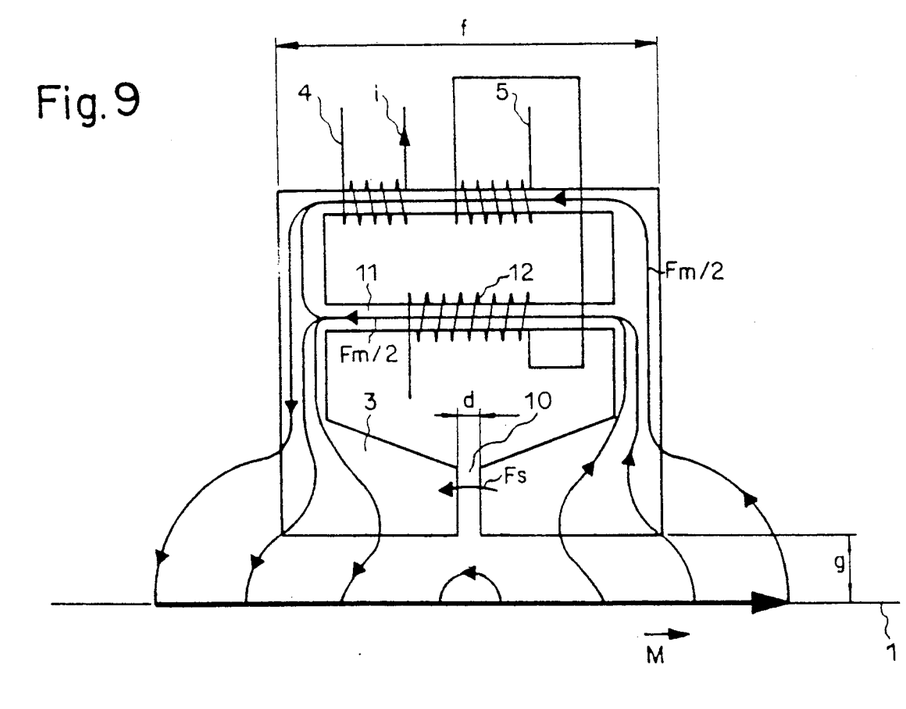
FIG. 9 is a second embodiment of a magnetic core and coils according to the invention.

FIG. 9 shows a second embodiment of the magnetic core 3 and is somewhat similar to the one shown in FIG. 8. Here the magnetic core 3 includes two magnetic circuits having a common connecting portion 11. The first of the two magnetic circuits includes a magnetic discontinuity 10 having a length d and the second magnetic circuit has no magnetic discontinuity. The first magnetic circuit is arranged relative to the bank note 1 the same as the magnetic core 3 shown in FIG. 8. The coils 4 and 5 are part of the second magnetic circuit. There is an additional coil 12 located on the common connecting portion 11 between the two magnetic circuits and having the same dimensions as the coil 5. Coil 5 is electrically connected in series to the coil 12 so that the arithmetic sum of the signals from the coils 5 and 12 are the output signal.

The useful magnetic flux Fm is divided into two substantially equal parts, each being Fm/2. One portion of the magnetic flux flows in the common connecting portion 11 while the other portion flows in the second magnetic circuit. The total output voltage produced by these two magnetic flux portions is the output voltage u and corresponds to the magnetic flux Fm in the series connected coils 5 and 12.

In FIG. 9, the magnetic discontinuity 10 can be several orders of magnitude greater than the magnetic discontinuity 10 in FIG. 8 because in FIG. 9 the magnetic circuit including the magnetic discontinuity 10 need not be excited by electrical current pulses i so that the leakage flux Fs amounts to only a few percent instead of half the magnetic flux. Thus, the leakage Fs in FIG. 9 is far less critical than the leakage flux in FIG. 8.

This important advantage of FIG. 9 as well as the fact that the odd-numbered harmonic signals of the rectangular output pulses shown in FIG. 7 cancel themselves in the output voltage u far exceeds the disadvantages of having the third coil 12. Furthermore, no demagnetization of the bank note 1 occurs because there is no magnetic discontinuity 10 in the exciting circuit and because the magnetic discontinuity 10 with its high induction values is relatively far away from the bank note 1.

Figure 10:
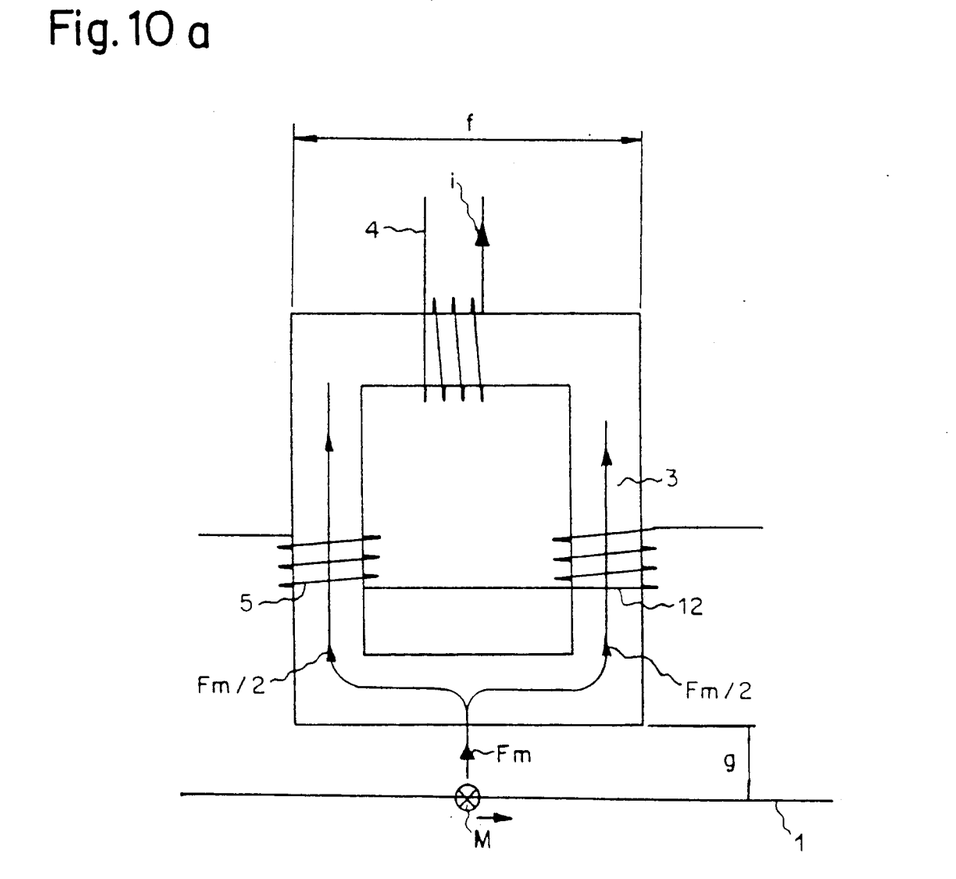
Figure 10B:
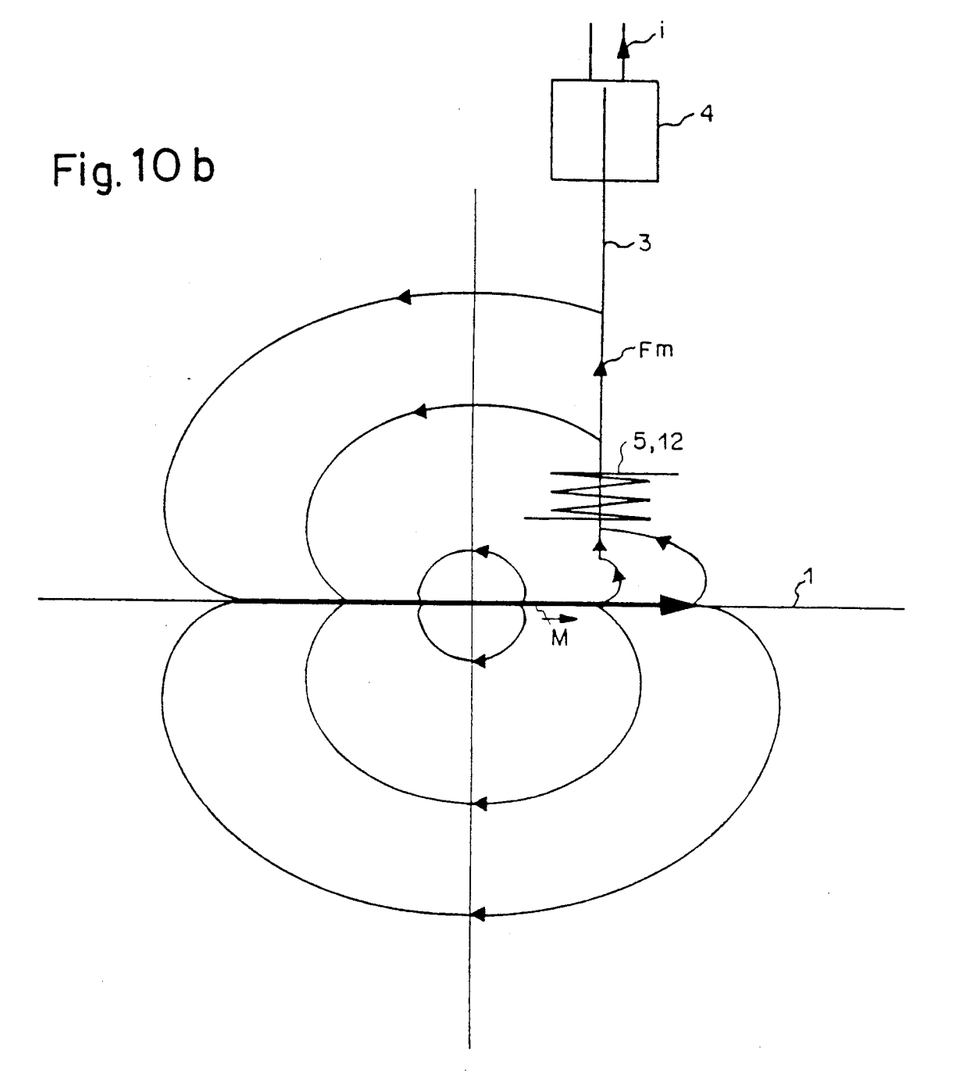

The third embodiment of the magnetic core 3 shown in FIGS. 10a and 10b is similar to the embodiment shown in FIG. 8 with the difference that the magnetic core 3 as well as the magnetic circuit do not include a magnetic discontinuity. In addition, a third coil 12 is present. The three coils 4, 5 and 12 are arranged and connected as indicated in the description of FIG. 3. It can be seen from FIG. 10a that each of the upper halves of Fm of the magnetic fields lines produced by the magnetization of the bank note 1 extend about halfway through one of the two vertical connecting portions of the magnetic core 3. Thereafter, the magnetic field lines leave the vertical connecting portions at different heights and then return to the bank note 1. The coils 5 and 12 are located near the bottom in proximity of the bank note 1 on the respective vertical connecting portions so that they can be enclosed by as many of the magnetic field lines as possible, resulting in a maximum output voltage u.

It can be appreciated that as shown in FIG. 10b, the magnetic field lines produced by the magnetized bank note 1 are always partially closed through space so that a sheared permeability always exists for them.

Generally, the output voltage u of the device 2 can be increased by using a relatively high frequency for the electrical current pulses i, e.g. about 100 kHz.

Figure 11:
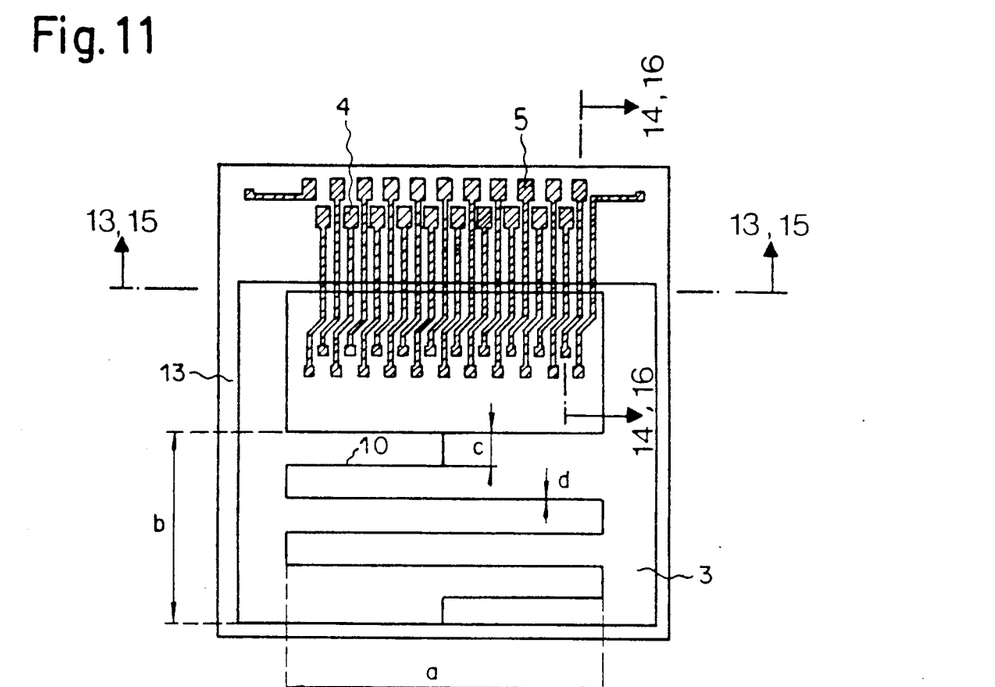
FIG. 11 is a plan view of the device depicted in FIG. 8.

FIG. 11 shows a plan view of an embodiment according to the invention as depicted in FIG. 8. FIG. 11 shows a top view of a substrate 13 which can be made of silicon or glass. The magnetic core 3 shown in FIG. 11 has the same form as shown in FIG. 8 including the magnetic discontinuity 10 shown in a solid line. In FIG. 11, the magnetic discontinuity 10 does not follow a straight path as in FIG. 8 but follows a meandering path.

The magnetic core 3 shown in FIG. 11 is fabricated on the substrate 13 in the form of a thin surface film. The extreme reduction of the cross-section of the magnetic core 3 in the invention results in a similar reduction in the demagnetization factor N and allows the use of highly permeable materials for the magnetic core 3 because the sheared permeability is known to be equal to $1/(N+1/\mu_r)$. The utilization of high values of $\mu_r$ are only reasonable when the values of the demagnetization factor N are extremely low. The ferromagnetic material of the magnetic core 3 has a relative permeability $\mu_4$ which has an order of magnitude of at least one hundred thousand ($10^5$). Accordingly, it is desirable to make the ferromagnetic material magnetic glass.

The conductors of the coils 4 and 5 are electrically insulated from the magnetic core 3 and are at least partly on an additional surface layer. Only the lower conductors of the coils 4 and 5 are shown hatched in FIG. 11 with no separating line indicated between the coils 4 and 5. The conductors shown on the left side of FIG. 11 are associated with the coil 4 and the conductors shown on the right side of FIG. 11 are associated with the coil 5. The conductors of the coils 4 and B can be located on an additional surface layer located on the substrate 13 and are, for the most part, nearly parallel to each other at least within their own surface layer. The relative positions of the different surface layers can be seen in FIGS. 13 to 16. The lower conductors of the coils 4 and B shown in FIG. 11 are located in an additional surface layer which is located below the surface film of the magnetic core 3.

Generally, the length of an edge of the substrate 13 is in the order of a few millimeters so that the lengths of the rectangular cylindrical coils 4 and 5 on the substrate 17 are very short. The coils 4 and 5 can be flat coils. It is known that flat coils exhibit poor winding factors, and the limited number of turns makes it desirable to use higher frequencies for the electrical current pulses i, preferably in the order of 100 kHz. Such a configuration of the coils results in the widening of the hysteresis loop so that the excitation coil 4 is preferably designed for a minimal ampere-turns requirement.

Any magnetization which brings the magnetic core 3 up to the point of saturation is associated with the amount of excitation in a sheared magnetic circuit such as a magnetic circuit having a magnetic discontinuity. This excitation is kept low for several reasons. There are relatively few turns of the coil 4 which has been fashioned as a flat coil, and the magnetic resistance R of the magnetic discontinuity 10 is likely to be as low as possible. In particular, $$R = \delta/\mu_o bt$$

where:
R = magnetic resistance of a magnetic discontinuity
$\delta$ = length of the magnetic discontinuity along its path such as shown in FIG. 11;
b = the width of the magnetic discontinuity such as indicated in FIG. 11;
t = the thickness of the magnetic core 3;
$\mu_o$ = the permeability of the magnetic discontinuity From the equation for R, it can be seen that a low value for the thickness t of the magnetic core 3 can be compensated for by having the width b of the discontinuity relatively large and/or by having the magnetic discontinuity 10 follow a meandering course in order to have its effective length relatively large. The magnetic flux lines in FIG. 11 (not shown) cross the meandering shaped magnetic discontinuity 10 at an angle $\alpha$ which is substantially perpendicular to the surface of the ferromagnetic material of the magnetic core 3. It is known that tan $\alpha$ is equal to r/l = 100,000/1 so that the angle $\alpha$ of the magnetic flux lines is substantially 90°.

The meandering configuration of the magnetic discontinuity formed from space of width, increases the effective width of the magnetic discontinuity from b to 4(a+c) so that a very wide magnetic discontinuity is created perpendicularly and transversely to the magnetic flux lines despite the limited width b of the corresponding connecting portion of the magnetic core 3. As shown in FIG. 11, the meandering configuration of the magnetic discontinuity has four periods. The length of the portion of the magnetic discontinuity 10 which is parallel to the corresponding connecting portion of the magnetic core 3 is designated as "a" and the portion of the magnetic discontinuity perpendicular and transverse to the corresponding connecting portion of the magnetic core 3 is designated as "c".

Figure 12:
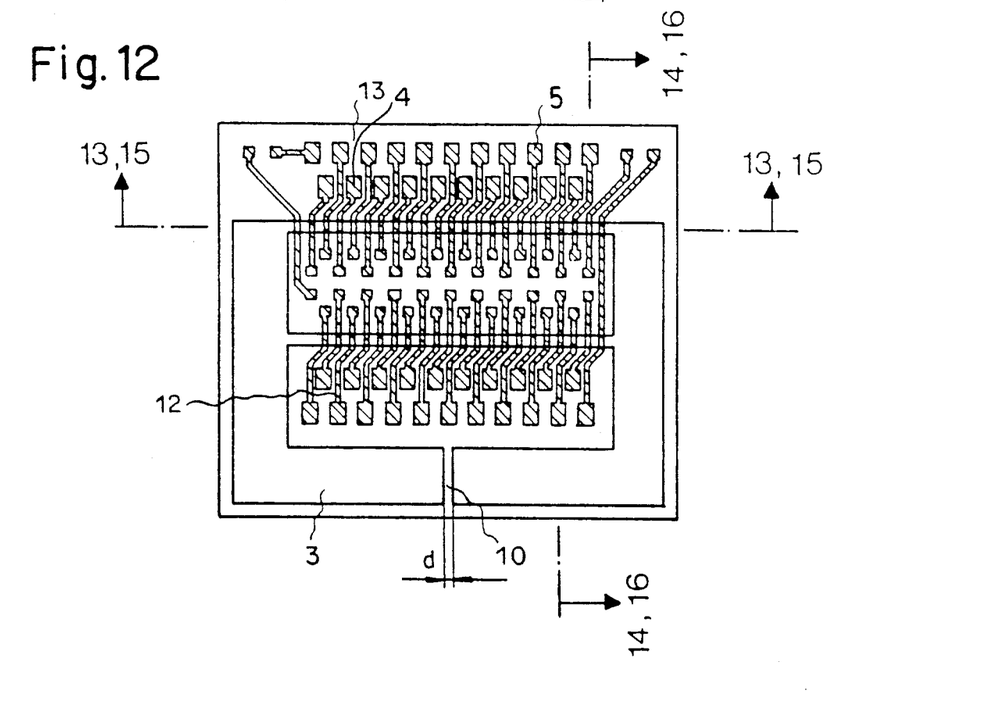
FIG. 12 is a plan view of the device depicted in FIG. 9.

FIG. 12 shows a plan view of an embodiment of the invention depicted in FIG. 9 and is similar to FIG. 11 with the difference that the magnetic core 3 in FIG. 9 differs from the magnetic core 3 in FIG. 8. FIG. 12 shows the two magnetic circuits of FIG. 9 and a magnetic discontinuity 10 which is a straight line. The magnetic flux produced by the excitation coil 4 flows only into the magnetic circuit lacking the magnetic discontinuity 10. The absence of the magnetic discontinuity 10 substantially reduces the excitation required for saturation.

FIG. 12 shows the lower conductors of the coil 12 which can be located on the same surface layer as the lower conductors of the coils 4 and 5. At least the conductors of the coil 12 which lie within one and the same surface layer are nearly parallel to each other. The coil 12 is also fabricated as a flat coil.

In both FIGS. 11 and 12, the conductors of each of the coils 4, 5, and 12 are located in one and the same surface layer substantially perpendicular and transverse to the corresponding connected portion of the magnetic core 3 located in another parallel surface layer.

The plan views of the embodiment shown in FIGS. 10a and 10b are similar to the plan view shown in FIG. 11 with the difference being that the magnetic discontinuity 10 is not present. The devices shown in plan views in FIGS. 11 and 12 can be fabricated either as shown in the FIGS. 13 and 14, or the FIGS. 15 and 16.

Figure 13:
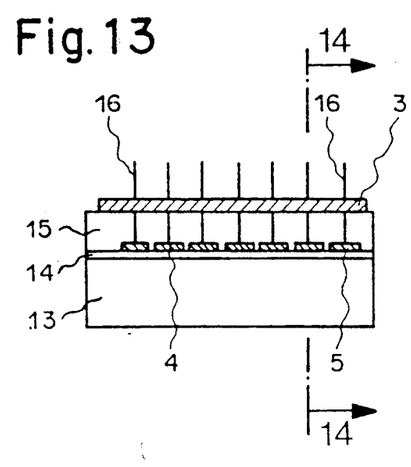
FIG. 13 is a sectional view taken along the line 13—13 in FIG. 11 or FIG. 12 showing a first embodiment of a spatial configuration of the invention.
Figure 14:
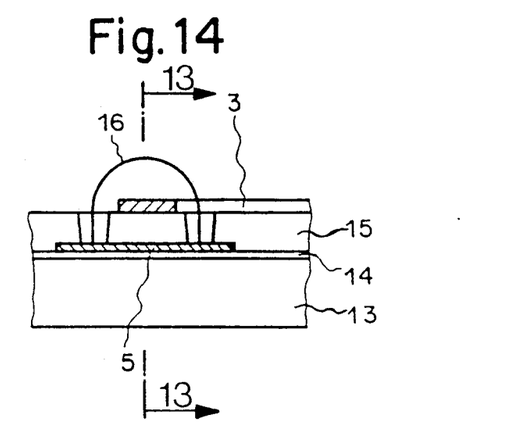
FIG. 14 is a sectional view taken along the line 14—14 in FIG. 11, FIG. 12, or FIG. 13 showing the first embodiment of the spatial configuration shown in FIG. 13.

The device shown in FIGS. 13 and 14 include a substrate 13, a SiO$_2$ layer 14 which defines the first surface layer containing the conductors of the lower winding halves of the coils 4 and 5 (and, if appropriate, of coil 12), and an insulating layer 15 which defines the second surface layer containing the magnetic core 3. As shown in FIG. 14, individual windings of the coils 4 and 5 (and, if applicable 12) are completed by bond wires 16 which extend out of each of the lower winding halves, traverse insulating layer 15, then go over the magnetic core 3, again traverse the insulating layer 15 and return to the lower winding halves.

Figure 15:
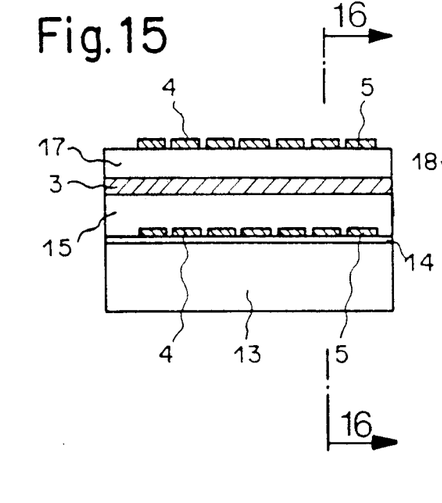
FIG. 15 is a sectional view taken along the line 15—15 in FIG. 11 or FIG. 12 showing a second embodiment of a spatial configuration of the invention.
Figure 16:
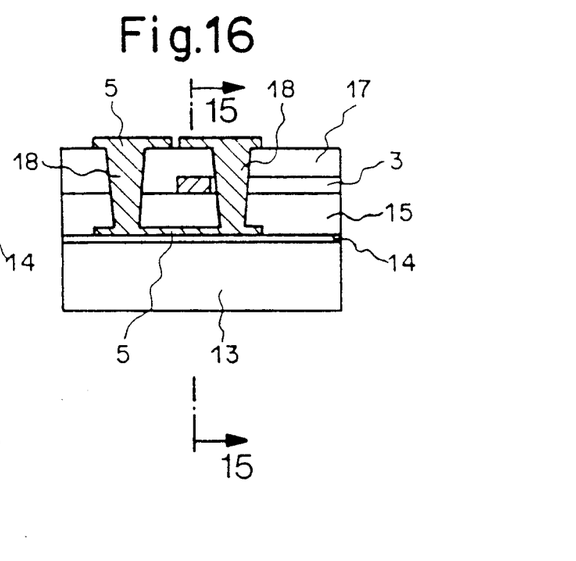
FIG. 16 is a sectional view taken along the lines 16—16 in FIG. 11, FIG. 12, or FIG. 15 showing a spatial configuration of the invention.

The device shown in FIGS. 15 and 16 also includes the substrate 13. The substrate 13 has the SiO$_2$ layer 14, a first surface layer containing the conductors of the lower winding halves of the coils 4 and 5 (and, if appropriate, the coil 12), the insulating layer 15, the second surface layer containing the magnetic core 3, another insulating layer 17 and a third surface layer containing the conductors of the upper winding halves of the coils 4 and 5 (and, if appropriate, the coil 12). Each of the lower and the upper winding halves of the coils 4, 5 and 12 are located in separate, parallel surface layers. The first surface layer is separated by the SiO$_2$ layer 14 from the surface of the semiconductor substrate 13 and is covered by the first insulating layer 15.

The second surface layer containing the magnetic core 3 is located on the surface of the insulating layer 15 and is covered by the insulating layer 17 which defines the third surface layer containing the upper winding halves of the coils 4, 5 and 12. As shown in FIG. 16, the individual windings of the coils 4, 5 and 12 are completed by the connectors 18 which are made of an electrically conductive material and which, starting at a winding half, traverse both insulating layers 15 and 17 to reach the connectors of the other winding halves.

The magnetic core 3 can be etched out of a piece of commercially obtainable metal glass by conventional photolithographic methods. The conductors of the flat coils 4, 5 and 12 can be made of a metal such as aluminum and the insulating layer 15 and 17 can be made of a conventional polymer such as polymer SP or photographic lacquer. Polymer Sp has the advantage that the surfaces of the insulating layers 15 and 17 can be ground flat before a subsequent layer is applied. The covered substrate 13 can have a thickness of approximately one millimeter and each edge can be from about 4 to about 8 mm. long.

The device according to the invention can be produced by conventional monolithic planar technology as well as by conventional hybrid technology. The latter technology is particularly suited for relatively large sizes.

Using planar technology and thin-film technology, the film thickness of the magnetic core 3 is preferably in the range of from about 0.1 micron to about 1 micron. The third and fourth embodiments of the device according to the invention shown in FIGS. 17a, 17b and 18 are particularly suited for such thin films.

Figure 17A:
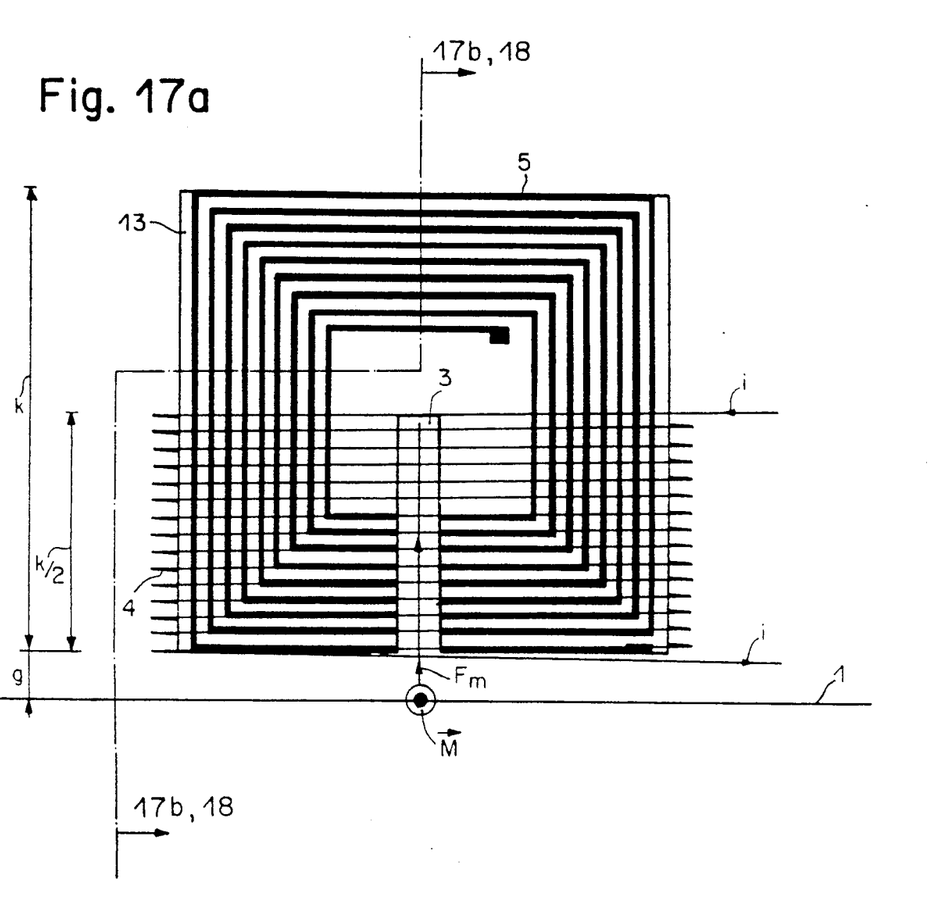
FIG. 17a is a sectional view of an arrangement for third and fourth embodiments of spatial configurations according to the invention.
Figure 17B:
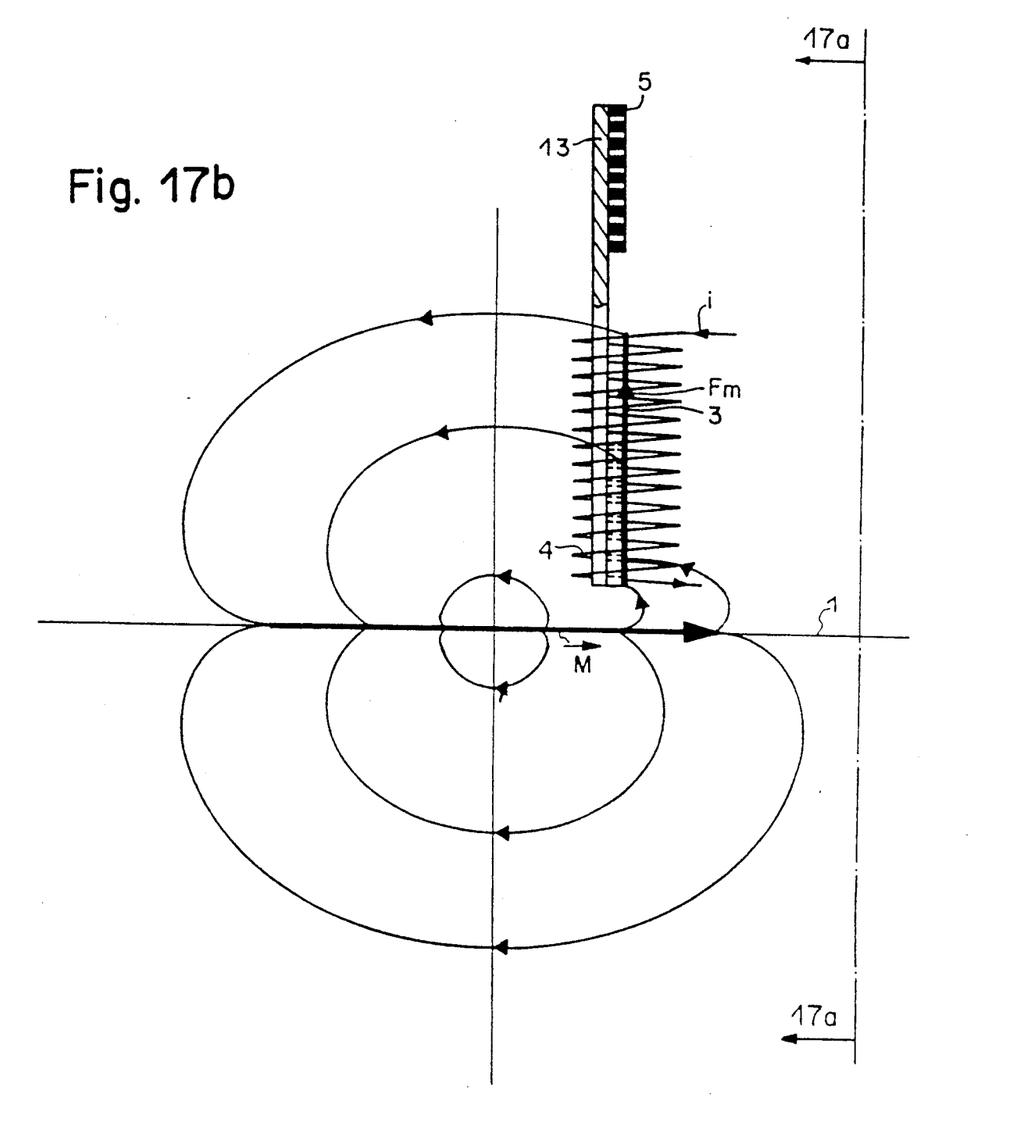
FIG. 17b is a sectional view of the arrangement shown in FIG. 17a along the lines 17o b-17b to show the third embodiment according to the invention.
Figure 18:
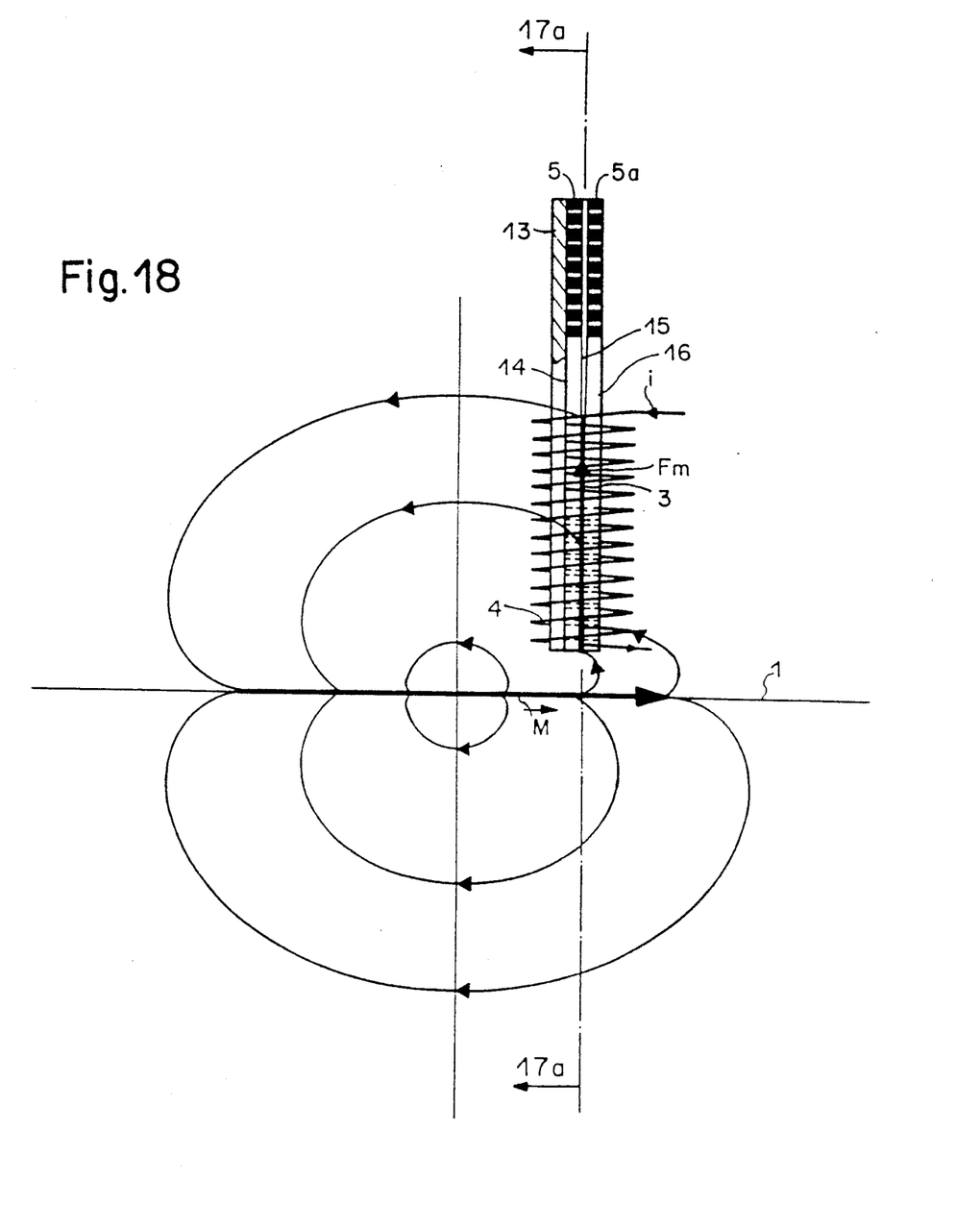
FIG. 18 is a sectional view of the arrangement shown in FIG. 17a along the line 18—18 to show the fourth embodiment according to the invention.

FIGS. 17a and 17b relate to the third embodiment of the invention depicted in FIG. 3 and show the coil B in the form of a spiral with its conductors arranged in a single plane between the substrate 13 and the magnetic core 3 on the surface of the substrate 13. The magnetic core in this case is in the form of a thin, oblong strip positioned substantially parallel to the surface of the substrate 13.

The coil 5 can take the form of a circular spiral (not shown) and the length of the magnetic core 3 is at the most equal to one half of the outer diameter of this coil 5 so that the magnetic core 3 starts at the outer edge of the coil 5 and is arranged so that its longitudinal axis lies radially with respect to the circular spiral configuration of the coil 5.

FIG. 17a shows the coil 5 in the form of a rectangular spiral. In this case, two parallel outer sides of the coil 5 face each other and are located at a distance g (or g +k) from the outer surface of the bank note 1, perpendicularly to the longitudinal axis of the magnetic core 3. The longitudinal axis of the magnetic core 3 is oriented vertically with respect to the surface of the bank note 1 and the length of the magnetic core 3 is at the most equal to one half k/2 of the width k of the coil 5, measured in the longitudinal direction of the magnetic core 3.

FIGS. 17a and 17b show that the coil 4 is wound around the substrate 13 and arranged relative to the coil 5 and the magnetic core 3 so that the axis of the coil 4 is substantially parallel to the axis of the magnetic core 3 and substantially perpendicular to the axis of the coil 5 while being substantially parallel to the surface of the substrate 13.

In the third embodiment, the coil 5 is present only below, on one side of the magnetic core 3, so that the magnetic coupling is generally limited to one half of the magnetic flux emerging from the magnetic core 3. In order to increase the magnetic coupling to almost 100%, a structure as shown in the fourth embodiment is desirable. In the fourth embodiment, poor magnetic coupling is limited to only the low magnetic flux emerging laterally from the thin edges of the magnetic core 3 and the amount of magnetic flux not coupled can be disregarded.

A fourth embodiment of the invention is described herein in connection with FIGS. 17a and 18. An additional output coil 5a is present and the coils 5 and 5a are arranged symmetrically relative the plane of the magnetic core 3. Only one magnetic core 3 is used. The coils 5 and 5a are connected in series in opposing directions. The additional coil 5a is electrically insulated and applied above as shown in FIG. 18 on the right side of both the coil 5 and the magnetic core 3 on the top of the substrate 13. The insulating layers 14, 15 and 16 are located between the coil 5, the coil 3 and the coil 5a.

Finally, the above-described embodiments to the invention are intended to be illustrative only. Numerous alternative embodiments may be devised by those skilled in the art without departing from the spirit and scope of the following claims.

I claim:

1. A device for measuring a weak magnetic flux comprising
   a substrate,
   a magnetic core formed as a surface film on a layer supported by said substrate and through which flows a magnetic flux to be measured,
   a first coil coupled to said magnetic core for receiving an input signal,
   a second coil coupled to said magnetic core,
   said magnetic core including fist and second magnetic circuits having a common connecting portion, the first of said magnetic circuits having a magnetic discontinuity and the second of said magnetic circuits having no magnetic discontinuity, said first and second coils being located on said second magnetic circuit,
   said device further including a third coil located on said connecting portion of said core and connected in series with said second coil so that the signals produced by said second and third coils add together to form an output signal corresponding to the magnetic flux to be measured,
   said first, second, and third coils each being formed at least in part by one or more flat conductors located between the top of said substrate and the layer on which said core is formed.

2. The device of claim 1 wherein said magnetic core is formed from a material having a magnetic permeability which is at least about $10^5$.

3. The device of claim 1 wherein said magnetic core has a thickness which is less than about 10 microns.

* * * * *